(12) United States Patent
Alrod et al.

(10) Patent No.: US 8,042,029 B2
(45) Date of Patent: Oct. 18, 2011

(54) ERROR CORRECTION DECODING BY TRIAL AND ERROR

(75) Inventors: Idan Alrod, Herzliya (IL); Eran Sharon, Rishon Lezion (IL); Simon Litsyn, Giv'at Shmuel (IL)

(73) Assignee: Ramot At Tel Aviv University Ltd., Tel Aviv (IL)

( * ) Notice: Subject to any disclaimer, the term of this patent is extended or adjusted under 35 U.S.C. 154(b) by 168 days.

(21) Appl. No.: 11/528,556

(22) Filed: Sep. 28, 2006

(65) Prior Publication Data

US 2007/0283227 A1 Dec. 6, 2007

Related U.S. Application Data

(63) Continuation-in-part of application No. 11/514,182, filed on Sep. 1, 2006.

(60) Provisional application No. 60/747,800, filed on May 21, 2006.

(51) Int. Cl.
*H03M 13/03* (2006.01)
(52) U.S. Cl. ...................................................... 714/791
(58) Field of Classification Search .................. 714/791
See application file for complete search history.

(56) References Cited

U.S. PATENT DOCUMENTS

| 4,882,731 A * | 11/1989 | van Gils ........................ 714/757 |
| 5,404,485 A | 4/1995 | Ban |
| 6,567,475 B1 | 5/2003 | Dent et al. |
| 6,633,856 B2 | 10/2003 | Richardson et al. |
| 6,721,373 B1 * | 4/2004 | Frenkel et al. ................ 375/346 |
| 7,031,408 B2 * | 4/2006 | Loeliger et al. ............... 375/341 |
| 7,266,750 B1 * | 9/2007 | Patapoutian et al. ......... 714/758 |
| 2005/0210358 A1 * | 9/2005 | Chouly et al. ................ 714/753 |
| 2007/0124652 A1 * | 5/2007 | Litsyn et al. .................. 714/776 |
| 2007/0283214 A1 * | 12/2007 | Lasser ........................... 714/758 |

OTHER PUBLICATIONS

U.S. Appl. No. 11/505,798, filed Aug. 2006, Lasser.
George C. Clark, Jr. and J. Bibb Cain, *Error Correction Coding for Digital Com*munications (Springer 1981).
S.Lin and D.J. Costello, *Error Control Coding: Fundamentals and Applications* (Prentice-Hall, 1983).
Branka Vucetic and Jonhong Yuan, *Turbo Codes: Principles and Applications* (Kluwer, 2000).

* cited by examiner

*Primary Examiner* — Scott Baderman
*Assistant Examiner* — Enam Ahmed
(74) *Attorney, Agent, or Firm* — Mark M. Friedman

(57) ABSTRACT

A representation of a codeword is decoded by applying a first decoder of the codeword to the representation of the codeword. If applying the first decoder fails to decode the representation of the codeword then a second decoder of the codeword is applied to the representation of the codeword. Preferably, applying the first decoder consumes less power and is faster than applying the second decoder. Data are ported by encoding the data as a codeword, exporting the codeword to a corrupting medium, importing a representation of the codeword, and applying a first decoder to the representation of the codeword. If applying the first decoder fails to decode the representation of the codeword then a second decoder of the codeword is applied to the representation of the codeword.

13 Claims, 3 Drawing Sheets

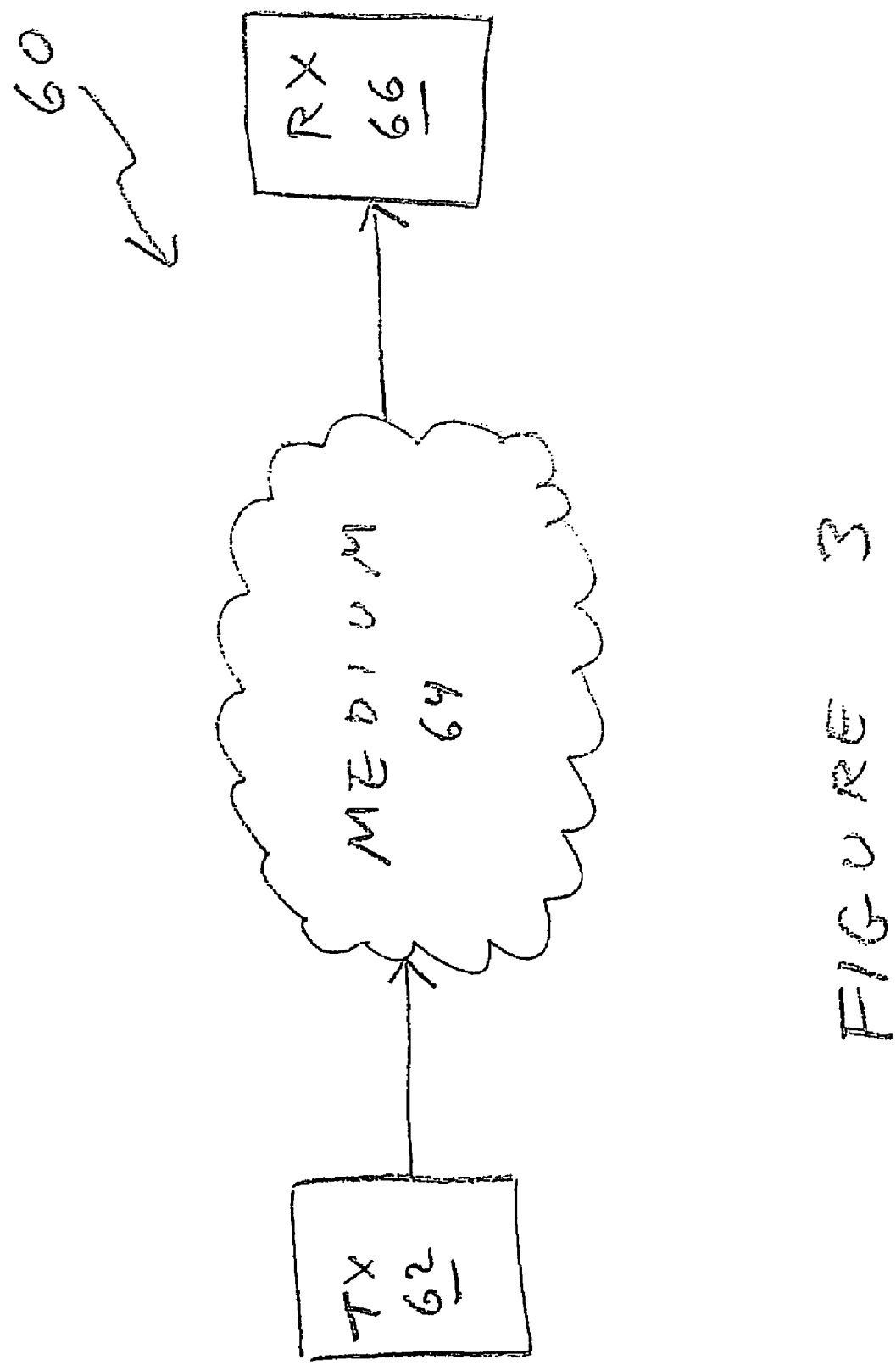

ERROR CORRECTION DECODING BY TRIAL AND ERROR

This patent application claims the benefit of U.S. Provisional Patent Application No. 60/747,800, filed May 21, 2006

This is a continuation-in-part of U.S. patent application Ser. No. 11/514,182, filed Sep. 1, 2006.

FIELD AND BACKGROUND OF THE INVENTION

The present invention relates to the decoding of a representation of a codeword and, more particularly, to a method and related systems for trial-and-error decoding of a representation of a codeword.

Flash memory devices have been known for many years. NAND-type flash memories differ from other types of flash memories (e.g. NOR-type), among other characteristics, by the fact that a certain number of information bits, written to the memory, may be read from the memory in a "flipped" state (i.e. different from the state that the original bits were written to the memory).

In order to overcome this phenomenon and to make NAND-type memories usable by real applications, it is a common technique to use Error Correction Codes (ECC) in conjunction with these memories. A general overview of using ECC in flash memories is presented below and includes the following steps:

(1) Before writing data to the memory, an ECC algorithm is applied to the data in order to compute additional (i.e. redundant) bits, which are later used for error detection and correction. These redundant bits are often called "parity bits" or "parity". A combination of the data input into an ECC module and the parity output by that module is called a codeword. Each different value of input data to an ECC module results in a different codeword.

(2) The entire codeword (i.e., the original data and the parity) is recorded to the flash memory. It should be noted, that the actual size of NAND-type flash memory is larger than the size of the original data, and the memory is designed to accommodate parity as well.

(3) When the data are retrieved from the memory, the entire codeword is read again, and an ECC algorithm is applied to the data and the parity in order to detect and correct possible "bit flips" (i.e., errors).

It should be noted that the implementation of ECC may be done by hardware, software, or a combination of hardware and software. Furthermore, ECC may be implemented within a memory device, within a memory device controller, within a host computer, or may be "distributed" among these components of a system.

The design of ECC algorithms is well known in the art. The algorithms in common use include Reed-Solomon, BCH, Hamming, and many others. Each ECC algorithm is composed of two parts—the part that receives the data bits and generates the parity bits (or equivalently, generates the codeword), and the part that receives the codeword and generates the corrected data bits. The first part is called the "encoder" and is used during writing, and the second part is called the "decoder" and is used, during reading. Each of the two parts may be implemented in either hardware or software, and it is also possible to have one part implemented in hardware while the other part implemented in software. It also is possible for each of the parts to be implemented in a combination of hardware and software, Receiving the data bits and generating the corresponding codeword is termed "encoding" herein. Receiving the codeword and generating the corrected data bits is termed "decoding" herein.

It should be noted that there actually are two kinds of ECC. The kind of ECC described above, in which the identity of the data bits is preserved in the codeword, is called "systematic" ECC. In "nonsystematic" ECC, the data bits are converted to a codeword in which the identity of the original data bits is not preserved.

Selecting an algorithm, like BCH, as the ECC algorithm to be used in a flash memory system, does not uniquely define the selected solution. Any such ECC algorithm is actually not a single algorithm but a family of algorithms. The algorithms within the same family differ among themselves in the amount of data bits they are able to protect. An algorithm that needs to protect 100 data bits is not identical to an algorithm that needs to protect 10,000 data bits, even though the two algorithms are typically quite similar and operate on the same principles.

But even two algorithms of the same family that both protect the same number of data bits are not necessarily identical. The algorithms may differ in the level of reliability provided, or equivalently—in the number of bit errors in the data that the algorithms are able to correct. For example, one system may require the protection of chunks of 1,000 data bits against any combination of up to 3 bit errors (but not against the occurrence of 4 or more bit errors), while in another system a much higher reliability is desired and therefore it is required to protect chunks of 1,000 data bits against any combination of up to 10 bit errors. Typically, protecting against more errors requires the use of more parity bits (or longer codewords), making the ECC scheme less "efficient", where efficiency is measured by the ratio of the number of data bits in a codeword to the total number of bits in the codeword (including, in systematic ECC, both data bits and parity bits). This measure is typically called the "rate" of the ECC coding.

Different ECC algorithms and implementations also differ in other aspects—speed of the encoding process, speed of the decoding process, complexity of the encoding process, complexity of the decoding process, acceptable error rate in the input to the decoder (defined according to the quality of the storage cells), and more. The complexity of encoding and decoding is important not only because it affects the speed of the operation, but also because it affects the power consumption and silicon area of hardware implementations of the ECC scheme.

It is thus evident that the selection of an ECC solution for a memory system involves a complex trade-off between multiple considerations. Some non-limiting rules-of-thumb typical in the art of ECC designs are:

a. For a given memory reliability, the better the output reliability (or equivalently the higher the number of correctable errors) the lower the rate of the code (or equivalently, for systematic ECC, the more parity bits are required)

b. For a given memory reliability, the better the output reliability, the more complex is the decoder.

c. For a given level of output reliability, the higher the rate of the code, the more complex is the decoder.

d. For a given level of output reliability, the higher the rate of the code, the slower is the decoding.

When designing an ECC solution, one typically starts from the error rate at the decoder's input (dictated by the quality of the storage cells) and the desired output reliability (dictated by the application's requirements). Based on these numbers one typically selects a specific ECC family, calculates the required number of parity bits, and then estimates the speed and complexity of the encoder and decoder.

In some cases the most important consideration for the system's designer is the speed of the decoding, as this may put a limit on the speed of reading the data out from the memory. For supporting systems where this is the case, US Patent Application Publication No. 2007/0283214 to Lasser entitled "Corruption-Resistant Data Porting With Multiple Error Correction Schemes", discloses a method in which two independent ECC schemes with different decoding speeds are used for protecting the same data. However, the method of Lasser suffers from the drawback that the memory must store the parity bits of both ECC schemes, resulting in a higher proportion of memory cells that are used for parity bits and therefore cannot be used to store real data. While there are systems in which there is no shortage of storage and hence the method of Lasser is useful, there are also cases where this is not so.

There are also cases in which the most important consideration for the system's designer is the power consumption of the circuitry implementing the decoding process. Typically, maximal power consumption is related to output reliability—with all other parameters fixed, correcting a larger number of errors typically consumes more power. However, as the input error rate and the output reliability are usually fixed for the designer, s/he cannot change them for the purpose of minimizing power consumption.

It would thus be very desirable to have an error correction solution that maximizes the average speed of decoding and/or minimizes the average power consumption of the decoder while still obtaining the desired output reliability, and in which that solution does not spend more storage for parity bits than is absolutely necessary for protecting the data bits to the required level.

SUMMARY OF THE INVENTION

According to the present invention there is provided a method of decoding a representation of a codeword, including the steps of: (a) applying a first decoder of the codeword to the representation of the codeword; and (b) if the applying of the first decoder fails to decode the representation of the codeword: applying a second decoder of the codeword to the representation of the codeword.

According to the present invention there is provided a receiver, for receiving a representation of a codeword, the receiver being operative: (a) to apply a first decoder of the codeword to the representation of the codeword; and (b) if the applying of the first decoder fails to decode the representation of the codeword: to apply a second decoder of the codeword to the representation of the codeword.

According to the present invention there is provided a controller, of a memory wherein is stored a representation of a codeword, the controller being operative: (a) to apply a first decoder of the codeword to the representation of the codeword; and (b) if the applying of the first decoder fails to decode the representation of the codeword: to apply a second decoder of the codeword to the representation of the codeword.

According to the present invention there is provided a memory device including: (a) a memory for storing a representation of a codeword; and (b) a controller operative: (i) to apply a first decoder of the codeword to the representation of the codeword, and (ii) if the applying of the first decoder fails to decode the representation of the codeword: to apply a second decoder of the codeword to the representation of the codeword.

According to the present invention there is provided a system for storing data, including: (a) a memory device for storing the data as a representation of a codeword; and (b) a processor operative: (i) to apply a first decoder of the codeword to the representation of the codeword, and (ii) if the applying of the first decoder fails to decode the representation of the codeword: to apply a second decoder of the codeword to the representation of the codeword.

According to the present invention there is provided a computer-readable storage medium having computer-readable code embodied on the computer-readable storage medium, the computer-readable code for decoding a representation of a codeword, the computer-readable code including: (a) program code for applying a first decoder of the codeword to the representation of the codeword; (b) program code for deciding whether the applying of the first decoder succeeds; and (c) program code for applying a second decoder of the codeword to the representation of the codeword if the applying of the first decoder fails.

The basic method of the present invention is a method of decoding a representation of a codeword. The input to the method is only a "representation" of a codeword because it cannot be guaranteed that the codeword to be decoded has not been corrupted since being encoded. In fact, it is that very corruption, i.e. the introduction of errors to the codeword, that necessitates error correction decoding, whether of the present invention or of the prior art. A first decoder of the codeword is applied to the representation of the codeword to decode the representation of the codeword. If the application of the first decoder fails to decode the representation of the codeword, then a second decoder of the codeword is applied to the representation of the codeword to decode the representation of the codeword.

The two decoders are decoders "of the codeword", in the sense that both decoders are designed in accordance with the encoding scheme that is used to encode the codeword. This distinguishes the present invention from the prior art method of Lasser. Lasser uses two different, independent ECC schemes. The present invention uses two different decoders of the same ECC scheme.

The first decoder may be either a soft decoder or an algebraic decoder. Similarly, the second decoder may be either a soft decoder or an algebraic decoder. "Soft" decoders and "algebraic" decoders are defined below.

Preferably, the two decoders share a common decoding algorithm. The two decoders then differ in having different respective values of at least one parameter of the algorithm. For example, in pure hardware implementations of the present invention, the two decoders could be hardwired into two different logic circuits, or the two decoders could share a common logic circuit, with a read/write memory being provided to store values of parameters of the common algorithm, and with the parameter values being changed depending on which decoder is being applied. More preferably, the parameter, or one of the parameters, is a number of bits used in at least one step of the algorithm. Most preferably, the decoders are soft decoders and the number of bits is a number of bits used by the algorithm in message passing.

Preferably, applying the first decoder to the representation of the codeword consumes less power than applying the second decoder to the representation of the codeword.

Preferably, applying the first decoder to the representation of the codeword is faster than applying the second decoder to the representation of the codeword.

The scope of the present invention also includes a receiver, for receiving a representation of a codeword, that applies the basic method to decode the representation of the codeword; a controller, of a memory wherein such a codeword representation is stored, that applies the basic method to decode the representation of the codeword; a memory device that includes both the controller and the memory; and a system, for storing data, that includes a memory device wherein the data are stored as a representation of a codeword and a processor that applies the basic method to decode the representation of the codeword.

The scope of the present invention also includes computer-readable storage media having computer-readable code embedded thereon for implementing the methods of the present invention.

The present invention is applicable to protecting data from corruption in at least two different circumstances. One circumstance is the storing of the data in a storage medium, followed by the retrieving of the data from the storage medium. The other circumstance is the transmitting of the data to a transmission medium, followed by the receiving of the data from the transmission medium. Therefore, the concepts of "storing" and "transmitting" of data are generalized herein to the concept of "exporting" data, and the concepts of "retrieving" and "receiving" data are generalized herein to the concept of "importing" data. Both "storing" data and "transmitting" data thus are special cases of "exporting" data, and "both "retrieving" data and "receiving" data are special cases of "importing" data. The process of "exporting" data and then optionally "importing" the data is termed herein "porting" data.

Therefore, according to the present invention there is provided a method of porting data, including the steps of: (a) encoding the data as a codeword; (b) exporting the codeword to a corrupting medium; (c) importing a representation of the codeword from the medium; (d) applying a first decoder of the codeword to the representation of the codeword; and (e) if the applying of the first decoder fails to decode the representation of the codeword: applying a second decoder of the codeword to the representation of the codeword.

According to the basic method of the present invention for porting data, the data are encoded as a codeword. The codeword is exported to a corrupting medium. A "corrupting" medium is a medium that may introduce errors t data that are exported to the medium, so that the corresponding imported data may not be identical to the exported data. Hence, the importation step of the basic method imports a representation of the codeword rather than the codeword itself. Of course, the representation of the codeword may be identical to the codeword, and in fact usually is identical to the codeword, but there is no a priori guarantee that the representation of the codeword is identical to the codeword. A first decoder of the codeword is applied to the representation of the codeword to decode the representation of the codeword. If the application of the first decoder fails to decode the representation of the codeword, then a second decoder is applied to the representation of the codeword to decode the representation of the codeword.

In one class of preferred embodiments, the medium is a transmission medium, such as free space for electromagnetic transmissions generally, a coaxial cable for RF transmissions or an optical fiber for optical transmissions. The exporting includes transmitting the codeword via the transmission medium.

In another class of preferred embodiments, the medium is a storage medium such as a RAM, a hard disk or a flash EEPROM. The exporting includes storing the codeword in the storage medium.

The codeword may be either a systematic codeword or a nonsystematic codeword.

BRIEF DESCRIPTION OF THE DRAWINGS

The invention is herein described, by way of example only, with reference to the accompanying drawings, wherein:

FIG. 3 is a schematic high-level block diagram of a data communication system of the present invention.

DESCRIPTION OF THE PREFERRED EMBODIMENTS

Figure 1:
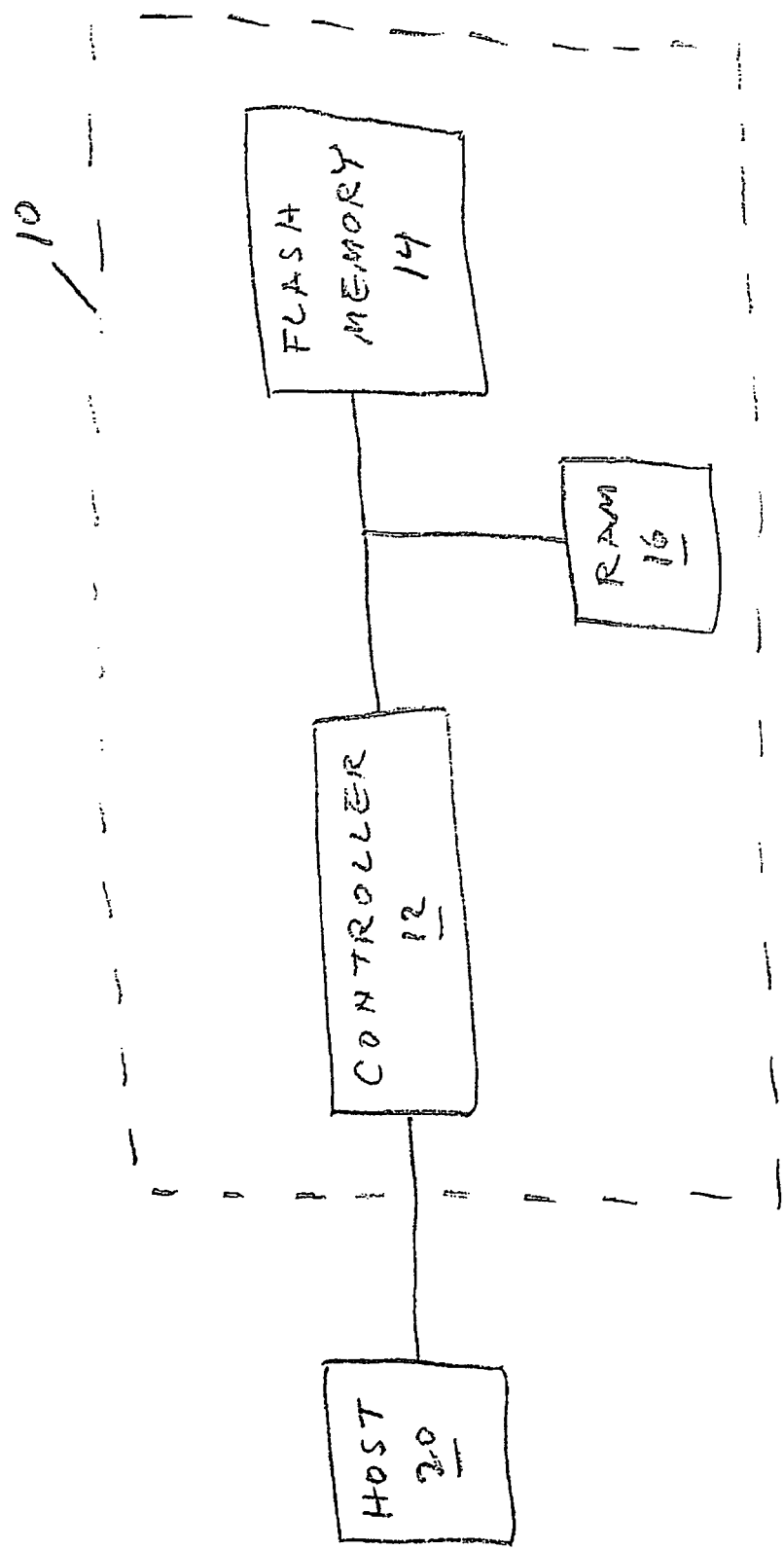
FIG. 1 is a high-level block diagram of a flash memory device of the present invention.

The principles and operation of error correction decoding according to the present invention may be better understood with reference to the drawings and the accompanying description.

According to the present invention, two different decoders are used for decoding the same codeword. It should be emphasized that the two decoders operate on the same codeword, containing the same parity bits, and therefore should be considered as two implementations of the same ECC decoding computation.

The present invention is truly innovative because to one ordinarily skilled in the art this approach would seem useless. Two computations implementing the solution of the same problem should not be expected to bring any advantage over only one computation solving the same problem. However, suppose we have two decoders (or one decoder capable of operating in two different modes) with the following characteristics:

a. The first decoder is fast and consumes little power, but on the other hand is not guaranteed to succeed in producing the result of the decoding process.

b. The second decoder is slower and consumes more power, but is guaranteed to always produce the correct result of the decoding process.

We now use the two decoders in the following manner:

a. Before writing data to the memory, the ECC algorithm is applied to the data bits in order to compute parity bits. A combination of the data bits and the parity bits provides for correcting the desired number of errors in the data.

b. The data bits and the parity bits, together forming the codeword, are all recorded into the flash memory.

c. When the data are retrieved from the memory, the entire content is read i.e. the data bits and the parity bits.

d. The first decoder is applied to the retrieved representation of the codeword. If the first decoder is successful in completing the decoding, the errors (if there were any) are corrected, the data is sent to the requesting software application and the reading operation ends.

e. If, on the other hand, the first decoder fails in completing the decoding, we apply the second decoder to the retrieved representation of the codeword. As the second decoder is guaranteed to succeed (as long as the number of errors is not beyond the correction capability of the ECC scheme), the decoding succeeds, all errors are corrected, the data are sent to the requesting software application and the reading operation ends.

Typically, the higher the number of errors in the data, the more frequently the first decoder fails. Because the probability of there being the maximal number of errors in the data is typically much smaller than the probability of there being the average number of errors in the data, if the first decoder is so designed that in most cases the first decoder succeeds, the resulting average decoding speed and power consumption is close to the speed and power consumption of the first decoder, which is the faster and less power-consuming of the two decoders. This can easily be seen from the following simplified calculation example.

Suppose the ECC used can correct up to three errors in the data of 1,000 bits, and the second decoder always succeeds in correcting up to three errors in 1,000 data bits. Suppose the first decoder always succeeds in correcting up to two errors and always fails in correcting three errors (in real life decoders there is usually no such clear-cut boundary of a number of errors that separates the failures from the successes, but this simplification makes our calculations simple).

Suppose the probability of one error in 1,000 data bits is $p_1=10^{-1}$ then the bit error probability (the probability that any data bit selected at random will be in error) (denoted as '$P_b$') satisfies $$p_1 = \binom{n}{1} \cdot p_b \cdot (1-p_b)^{n-1}.$$

Using n=1,000 we get that $p_b \approx 1.12 \times 10^{-4}$. Now we can approximate the probability of two errors in the data as $\approx 5.6 \times 10^{-3}$ (it can be shown that this probability will not practically change for any value of n above 100 and $p_1<0.25$) and the probability of three errors in the 1,000 data bits is $\approx 2.08 \times 10^{-4}$.

If the decoding time of the first decoder is 10 microseconds and the decoding time of the second decoder is 1,000 microseconds, and if the power consumption of the first decoder is 10 milliwatts and the power consumption of the second decoder is 50 milliwatts, then the average decoding time of the above method is approximately $T=(1-2\cdot10^{-4})\cdot10+2\times10^{-4}\times(1000+10)=10.2$ microseconds, and the average power consumption is approximately $P=(1-2\cdot10^{-4})\cdot10+2\cdot10^{-4}\cdot(50+10)=10.01$ milliwatts. (The calculation of the average power consumption was done as if in the case of three errors both decoders operate in parallel. This is not accurate, but the inaccuracy is negligible). If the probability of an error in the data is lower than in the above example (as is the case in many types of flash memories), then the average speed and average power consumption of the above method get even much closer to the speed and power of the first decoder.

Therefore we see that the method of the present invention achieves all of the following goals together:
 a. providing a fast decoding time;
 b. providing low power consumption;
 c. providing the desired reliability level at the output of the memory system; and
 d. not using more parity bits than the number of parity bits that are required for the same reliability level in the prior art methods (as when using only the second decoder).

It should be noted that the benefits of the present invention do not come free. In the rare cases that the first decoder fails, we pay twice the decoding time as we eventually run the decoding process twice. Even though the effect of this on the average decoding time is negligible, it does increase the maximum decoding time, or equivalently the maximum latency in providing the data to the requesting application. However, as this occurs quite rarely, the benefit of the present invention usually far outweighs this disadvantage.

There is an important class of ECC algorithms for which the above method is especially useful. This is the class of "soft decoders", with the Turbo decoder being the most well known algorithm in this class. Such algorithms are described e.g. in George C. Clark, Jr. and J. Bibb Cain, *Error Correction Coding for Digital Communications* (Springer, 1981), in S. Lin and D. J. Costello, *Error Control Coding: Fundamentals and Applications* (Prentice-Hall, 1983) and in Branka Vucetic and Jinhong Yuan, Turbo Codes: Principles and Applications (Kluwer, 2000). Although these references are directed at the use of soft ECC algorithms in communications, it will be clear to those skilled in the art how to adapt those algorithms to error correction in memories. Any decoder that is not a soft decoder is herein called "an algebraic decoder".

Soft decoders operate by assigning a probability to each bit of the codeword (e.g. the probability that the value of the bit is 1 and not 0), and running multiple iterations in each of which the probability of each bit is changed according to the current probabilities of other bits. This type of calculation is said to employ "message passing" techniques, as each bit "passes messages" to its peers. A major design decision in implementing such decoders is the bus width of the message passing. Using a wide bus (for example 10 bits) assures that if the algorithm can cope with the errors, the algorithm will indeed converge to the correct data. But on the other hand, the power consumption of the decoder is high in such design. Using a narrow bus (for example 3 bits) provides much lower power consumption, but the decoder might fail to converge to the correct data in cases with relatively large number of errors (even if the same pattern of data and errors is correctly decoded in a corresponding wide bus decoder). The number of bits used for message passing has a major influence on the power consumption of the decoding process—the higher the number of bits, the higher the power consumption.

One of the reasons for this phenomenon is that the soft decoder's messages and channel inputs (soft values) are stored in a large-power-consuming RAM during the decoding operation. When for example we use 3 bits instead of 10 bits per message, 70% of the RAM can be shut down. Another source of power consumption saving is the processing units that process these passing messages. It is evident that performing computations on 3 bits instead of 10 bits requires smaller and less-power-consuming units.

It is possible to implement a soft decoder in which the number of bits in the "message passing" can be set at the beginning of the decoding. Applying the methods of the present invention to such decoder, the decoder is used in the following way:
 a. Before writing data to the memory, the ECC algorithm is applied to the data bits in order to compute parity bits. A combination of the data bits and the parity bits provides for correcting the desired number of errors in the data.
 b. The data bits and the parity bits, together forming the codeword, are all recorded into the flash memory.
 c. When the data are retrieved from the memory, the entire content is read—the data bits and the parity bits.
 d. The soft decoder is applied to the retrieved representation of the codeword, using a small number of bits for message passing. If the decoder is successful in completing the decoding, the errors (if there were any) are corrected, the data are sent to the requesting software application and the reading operation ends.
 e. If, on the other hand, the first attempt fails in completing the decoding, we apply the soft decoder to the retrieved representation of the codeword a second time, this time with a large number of bits for message passing. As this second decoding is guaranteed to succeed (as long as the error pattern is not beyond the correction capability of the ECC scheme), the decoding succeeds, all errors are corrected, the data are sent to the requesting software application and the reading operation ends.

Even though the methods of the present invention are useful for many types of systems, these methods are especially useful for flash memory systems. This is because the error rate of flash memories is time dependent. Right after storing data into a flash memory its reliability is relatively high, but as time passes that same data are read out with lower and lower reliability. This is the result of the charge in the memory cells' gates leaking out over time. Another effect in flash memories is that while a fresh device has a relatively high reliability, a much used device (one that had undergone many write and erase cycles) has much lower reliability.

When designing ECC schemes for protecting data stored in a flash memory system one has to protect against the worst-case scenarios—heavily-used device and data read long after having been written. But these worst-case assumptions are not correct in the majority of the actual read operations. Therefore, prior art systems pay the speed and power penalty of the worst-case solution even though this is not really required. The methods of the present invention do not pay the penalty—when the device is fresh or the data were only recently written then only the first decoder is put to work. Only when actually encountering the worst-case circumstances is the second decoder used.

The scope of the present invention includes the error correction methods described above. The present invention is not limited to flash memory systems, but is also applicable to any type of memory—magnetic, optical, or any other. The scope of the invention also includes a memory system including a memory and a controller for the memory that employs the methods of the present invention. The scope of the present invention also includes a computing system including a memory system that employs the methods of the present invention. The scope of the present invention also includes a computing system that includes a memory and a host computer and that employs the methods of the present invention, with no dedicated memory controller being used.

The ECC of the present invention may be either systematic or non-systematic. In systematic ECC, the error correction algorithm takes the original data bits, appends to the original data bits some parity bits, and stores both the original data bits and the parity bits. Thus, the original data bits are preserved by the encoding process and can be identified among the stored bits. Later, when the stored bits are read, both the data bits and the parity bits are read, and the parity bits enable the correction of errors in the read data bits. In non-systematic ECC, the original data bits are not preserved and are not stored. Instead, the encoding process transforms the original data bits into a larger group of bits (herein called "protected bits") that are the bits actually stored. When the stored bits are read, the original bits are regenerated from the stored bits. There is no direct correspondence between a specific original data bit and a specific stored bit.

It should be noted that the methods of the present invention are not limited to memory systems. Error correction is also employed in communication systems, to recover from errors introduced into transmitted data bits while on their way to their destination. The claims of the present invention should therefore also be construed to apply to error correction methods and systems employed in correcting errors in transmitted data.

Referring now to the drawings, FIG. 1 is a high-level block diagram of a flash memory device 10 of the present invention, coupled to a host 20. FIG. 1 is adapted from FIG. 1 of Ban, U.S. Pat. No. 5,404,485, which patent is incorporated by reference for all purposes as if fully set forth herein. Flash memory device 10 includes a flash memory 14, a controller 12 and a random access memory (RAM) 16. Controller 12, that corresponds to "flash control 14" of U.S. Pat. No. 5,404,485, manages flash memory 14, with the help of RAM 16, as described in U.S. Pat. No. 5,404,485. When writing data to flash memory 14, controller 12 applies error correction encoding. When reading data from flash memory 14, controller 12 applies the error correction method of the present invention as described above.

Figure 2:
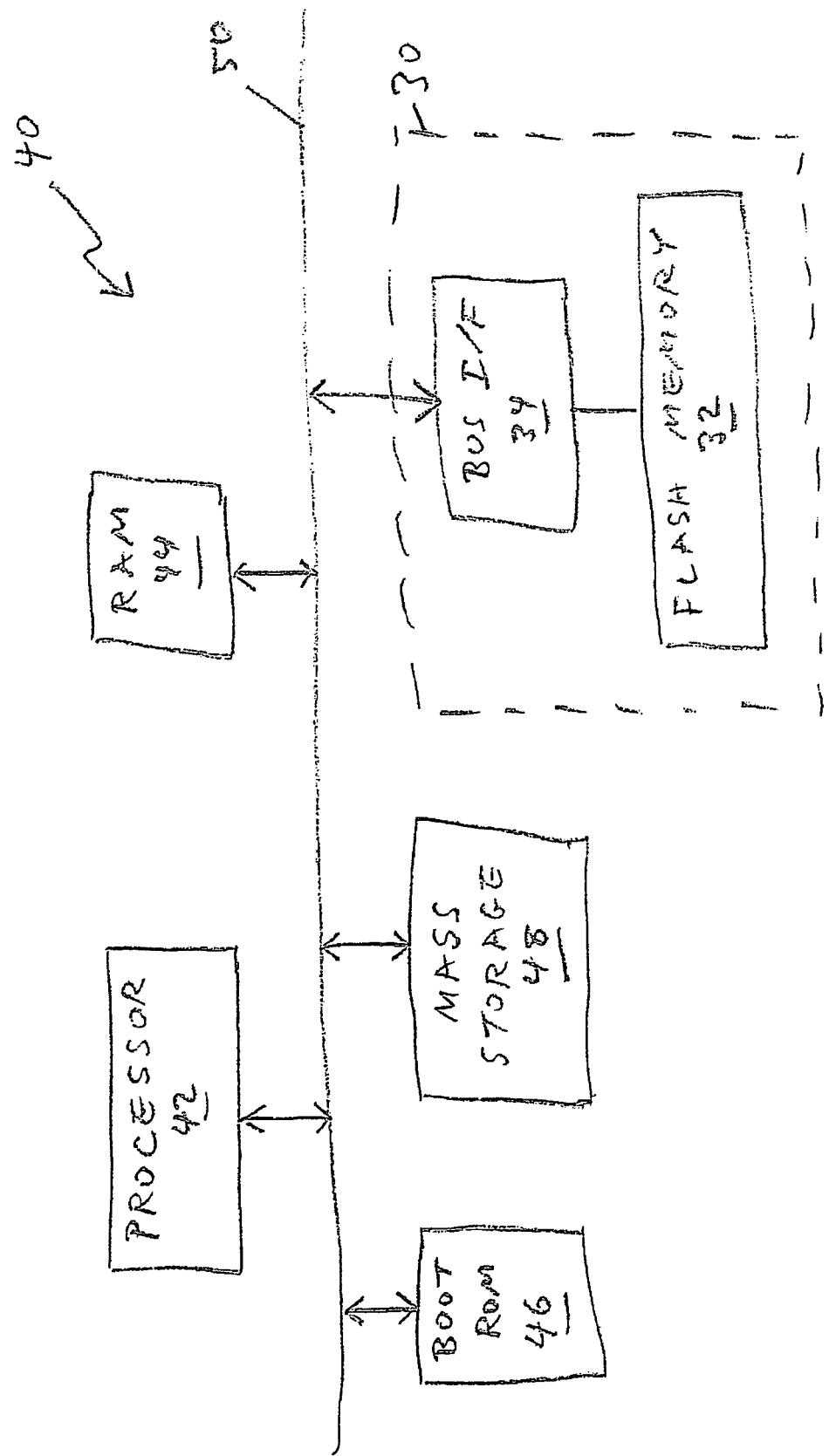
FIG. 2 is a high-level partial block diagram of a data storage system of the present invention.

FIG. 2 is a high-level partial block diagram of a data storage system 40 of the present invention. Data storage system 40 includes a processor 42 and four memory devices: a RAM 44, a boot ROM 46, a mass storage device (hard disk) 48 and a flash memory device 30, all communicating via a common bus 50. Like flash memory device 10, flash memory device 30 includes a flash memory 32. Unlike flash memory device 10, flash memory device 30 lacks its own controller and RAM. Instead, processor 42 emulates controller 12 by executing a software driver that implements the methodology of U.S. Pat. No. 5,404,485 in the manner e.g. of the TrueFFS™ driver of msystems Ltd. of Kfar Saba, Israel. When writing data to flash memory device 30, processor 42 applies error correction encoding. When reading data from flash memory device 30, processor 42 applies the error correction method of the present invention as described above. Flash memory device 30 also includes a bus interface 34 to enable processor 42 to communicate with flash memory 32.

The code of the software driver that processor 42 executes to manage flash memory 32 is stored in mass storage device 48 and is transferred to RAM 44 for execution. Mass storage device 48 thus is an example of a computer-readable code storage medium in which is embedded computer-readable code for managing flash memory 32 according to the principles of the present invention.

FIG. 3 is a schematic high-level block diagram of a data communication system 60 of the present invention. System 60 includes a transmitter 62, a transmission medium 64 and a receiver 66. Transmitter 62 transmits data to receiver 66 via medium 64. Before transmitting the data, transmitter 62 applies error correction encoding to the data. Upon receiving the transmitted data, receiver 66 applies the error correction decoding of the present invention to the data.

Transmission medium 64 may be any suitable medium for transmitting data using any suitable carrier of the data. Common examples of such media include free space and coaxial cables for radio frequency transmissions, and optical fibers for optical frequency transmissions. Transmitter 62 and receiver 66 are adapted to the nature of transmission medium 64. Data communication systems similar to system 60 that use prior art methods for error correction decoding are well known, and it is straightforward for one ordinarily skilled in the art to modify such a prior art system to use the error correction decoding methodology of the present invention.

While the invention has been described with respect to a limited number of embodiments, it will be appreciated that many variations, modifications and other applications of the invention may be made.

What is claimed is:

1. A method of decoding a representation of a codeword, comprising the steps of:
    (a) applying a first decoding mode of the codeword to the representation of the codeword; and
    (b) only if said applying of said first decoding mode fails to decode the representation of the codeword: applying a second decoding mode of the codeword to the representation of the codeword;
wherein said decoding modes are soft decoding modes that share a common decoding algorithm and said decoding modes have different respective values of a number of bits used by said algorithm in message passing.

2. The method of claim 1, wherein said applying of said first decoding mode to the representation of the codeword consumes less power than said applying of said second decoding mode to the representation of the codeword.

3. The method of claim 1, wherein said applying of said first decoding mode to the representation of the codeword is faster than said applying of said second decoding mode to the representation of the codeword.

4. A receiver, for receiving a representation of a codeword, the receiver being operative:
   (a) to apply a first decoding mode of the codeword to the representation of the codeword; and
   (b) only if said applying of said first decoding mode fails to decode the representation of the codeword: to apply a second decoding mode of the codeword to the representation of the codeword;
wherein said decoding modes are soft decoding modes that share a common decoding algorithm and said decoding modes have different respective values of a number of bits used by said algorithm in message passing.

5. A controller, of a memory wherein is stored a representation of a codeword, the controller being operative:
   (a) to apply a first decoding mode of the codeword to the representation of the codeword; and
   (b) only if said applying of said first decoding mode fails to decode the representation of the codeword: to apply a second decoding mode of the codeword to the representation of the codeword;
wherein said decoding modes are soft decoding modes that share a common decoding algorithm and said decoding modes have different respective values of a number of bits used by said algorithm in message passing.

6. A memory device comprising:
   (a) a memory for storing a representation of a codeword; and
   (b) a controller operative:
      (i) to apply a first decoding mode of the codeword to said representation of said codeword, and
      (ii) only if said applying of said first decoding mode fails to decode said representation of said codeword: to apply a second decoding mode of the codeword to said representation of said codeword;
wherein said decoding modes are soft decoding modes that share a common decoding algorithm and said decoding modes have different respective values of a number of bits used by said algorithm in message passing.

7. A system for storing data, comprising:
   (a) a memory device for storing the data as a representation of a codeword; and
   (b) a processor operative:
      (i) to apply a first decoding mode of the codeword to said representation of said codeword, and
      (ii) only if said applying of said first decoding mode fails to decode said representation of said codeword: to apply a second decoding mode of the said codeword to said representation of said codeword;
wherein said decoding modes are soft decoding modes that share a common decoding algorithm and said decoding modes have different respective values of a number of bits used by said algorithm in message passing.

8. A computer-readable storage medium having computer-readable code embodied on the computer-readable storage medium, the computer-readable code for decoding a representation of a codeword, the computer-readable code comprising:
   (a) program code for applying a first decoding mode of the codeword to the said representation of the codeword;
   (b) program code for deciding whether said applying of said first decoding mode succeeds; and
   (c) program code for applying a second decoding mode of the codeword to the representation of the codeword only if said applying of said first decoding mode fails;
wherein said decoding modes are soft decoding modes that share a common decoding algorithm and said decoding modes have different respective values of a number of bits used by said algorithm in message passing.

9. A method of porting data, comprising the steps of:
   (a) encoding the data as a codeword;
   (b) exporting said codeword to a corrupting medium;
   (c) importing a representation of said codeword from said medium;
   (d) applying a first decoding mode of said codeword to said representation of said codeword; and
   (e) only if said applying of said first decoding mode fails to decode said representation of said codeword: applying a second decoding mode of said codeword to said representation of said codeword;
wherein said decoding modes are soft decoding modes that share a common decoding algorithm and said decoding modes have different respective values of a number of bits used by said algorithm in message passing.

10. The method of claim 9, wherein said medium is a transmission medium and said exporting includes transmitting said codeword via said transmission medium.

11. The method of claim 9, wherein said medium is a storage medium and said exporting includes storing said codeword in said storage medium.

12. The method of claim 9, wherein said codeword is a systematic codeword.

13. The method of claim 9, wherein said codeword is a nonsystematic codeword.

* * * * *